United States Patent
Wober

(10) Patent No.: US 8,791,470 B2
(45) Date of Patent: Jul. 29, 2014

(54) NANO STRUCTURED LEDS

(75) Inventor: Munib Wober, Topsfield, MA (US)

(73) Assignee: Zena Technologies, Inc., Cambridge, MA (US)

( * ) Notice: Subject to any disclaimer, the term of this patent is extended or adjusted under 35 U.S.C. 154(b) by 64 days.

(21) Appl. No.: 12/573,582

(22) Filed: Oct. 5, 2009

(65) Prior Publication Data

US 2011/0079796 A1    Apr. 7, 2011

(51) Int. Cl.
| | |
|---|---|
| H01L 27/15 | (2006.01) |
| H01L 31/12 | (2006.01) |
| H01L 27/14 | (2006.01) |
| H01L 27/144 | (2006.01) |
| H01L 33/06 | (2010.01) |
| H01L 33/00 | (2010.01) |

(52) U.S. Cl.
CPC ............ H01L 27/1446 (2013.01); *H01L 33/06* (2013.01); *H01L 33/0012* (2013.01); H01L 27/14 (2013.01); *H01L 27/156* (2013.01)
USPC .... 257/84; 257/80; 257/E33.077; 257/31.109

(58) Field of Classification Search
USPC .............. 257/80, 82, 432, 458, 461, E31.109, 257/E33.076, E33.077, 83, 84
See application file for complete search history.

(56) References Cited

U.S. PATENT DOCUMENTS

| | | |
|---|---|---|
| 1,918,848 A | 4/1929 | Land |
| 3,903,427 A | 9/1975 | Pack |
| 4,017,332 A | 4/1977 | James |
| 4,357,415 A | 11/1982 | Hartman |
| 4,387,265 A | 6/1983 | Dalal |
| 4,400,221 A | 8/1983 | Rahilly |
| 4,443,890 A * | 4/1984 | Eumurian ..................... 398/141 |
| 4,513,168 A | 4/1985 | Borden |
| 4,620,237 A | 10/1986 | Traino |
| 4,678,772 A | 7/1987 | Segal et al. |
| 4,827,335 A | 5/1989 | Saito |
| 4,846,556 A | 7/1989 | Haneda |
| 4,880,613 A | 11/1989 | Satoh |

(Continued)

FOREIGN PATENT DOCUMENTS

| | | |
|---|---|---|
| EP | 0809303 B1 | 9/2006 |
| GB | 2348399 A | 4/2000 |

(Continued)

OTHER PUBLICATIONS

William Shockley and H. Queisser, Detailed Balance Limit of Efficiency of p-n Junction Solar Cells, J. of Appl. Physics, Mar. 1961, 32(3).

(Continued)

*Primary Examiner* — Robert Huber
(74) *Attorney, Agent, or Firm* — Pillsbury Winthrop Shaw Pittman LLP

(57) ABSTRACT

An embodiment relates to a nanowire-containing LED device with optical feedback comprising a substrate, a nanowire protruding from a first side the substrate, an active region to produce light, a optical sensor and a electronic circuit, wherein the optical sensor is configured to detect at least a first portion of the light produced in the active region, and the electronic circuit is configured to control an electrical parameter that controls a light output of the active region. Yet, another embodiment relates to an image display having the nanowire-containing LED device with optical feedback.

48 Claims, 4 Drawing Sheets

(56) References Cited

U.S. PATENT DOCUMENTS

| | | | |
|---|---|---|---|
| 4,896,941 | A | 1/1990 | Hayashi |
| 4,950,625 | A | 8/1990 | Nakashima |
| 4,971,928 | A | 11/1990 | Fuller |
| 4,972,244 | A | 11/1990 | Buffet |
| 5,096,520 | A | 3/1992 | Faris |
| 5,124,543 | A | 6/1992 | Kawashima |
| 5,247,349 | A | 9/1993 | Olego |
| 5,272,518 | A | 12/1993 | Vincent |
| 5,311,047 | A | 5/1994 | Chang |
| 5,347,147 | A | 9/1994 | Jones |
| 5,362,972 | A | 11/1994 | Yazawa et al. |
| 5,374,841 | A | 12/1994 | Goodwin |
| 5,401,968 | A | 3/1995 | Cox |
| 5,449,626 | A | 9/1995 | Hezel |
| 5,468,652 | A | 11/1995 | Gee |
| 5,602,661 | A | 2/1997 | Schadt |
| 5,612,780 | A | 3/1997 | Rickenbach |
| 5,671,914 | A | 9/1997 | Kalkhoran |
| 5,696,863 | A | 12/1997 | Kleinerman |
| 5,723,945 | A | 3/1998 | Schermerhorn |
| 5,747,796 | A | 5/1998 | Heard |
| 5,767,507 | A | 6/1998 | Unul |
| 5,798,535 | A | 8/1998 | Huang et al. |
| 5,844,290 | A | 12/1998 | Furumiya |
| 5,853,446 | A | 12/1998 | Carre |
| 5,857,053 | A | 1/1999 | Kane |
| 5,877,492 | A | 3/1999 | Fujieda |
| 5,880,495 | A | 3/1999 | Chen |
| 5,885,881 | A | 3/1999 | Ojha |
| 5,900,623 | A | 5/1999 | Tsang et al. |
| 5,943,463 | A | 8/1999 | Unuma |
| 5,968,528 | A | 10/1999 | Deckner et al. |
| 6,033,582 | A | 3/2000 | Lee |
| 6,037,243 | A | 3/2000 | Ha et al. |
| 6,046,466 | A | 4/2000 | Ishida et al. |
| 6,074,892 | A | 6/2000 | Bowers et al. |
| 6,100,551 | A | 8/2000 | Lee et al. |
| 6,270,548 | B1 | 8/2001 | Campbell |
| 6,301,420 | B1 | 10/2001 | Greenaway |
| 6,326,649 | B1 | 12/2001 | Chang |
| 6,388,243 | B1 | 5/2002 | Berezin |
| 6,388,648 | B1 | 5/2002 | Clifton |
| 6,407,439 | B1 | 6/2002 | Hier |
| 6,459,034 | B2 | 10/2002 | Muramoto et al. |
| 6,463,204 | B1 | 10/2002 | Ati |
| 6,542,231 | B1 | 4/2003 | Garrett |
| 6,563,995 | B2 | 5/2003 | Kane |
| 6,566,723 | B1 | 5/2003 | Vook |
| 6,680,216 | B2 | 1/2004 | Kwasnick et al. |
| 6,709,929 | B2 | 3/2004 | Zhang |
| 6,720,594 | B2 | 4/2004 | Rahn |
| 6,771,314 | B1 | 8/2004 | Bawolek |
| 6,805,139 | B1 | 10/2004 | Savas |
| 6,812,473 | B1 | 11/2004 | Amemiya |
| 6,927,145 | B1 | 8/2005 | Yang |
| 6,960,526 | B1 | 11/2005 | Shah |
| 6,967,120 | B2 | 11/2005 | Jang |
| 6,969,899 | B2 | 11/2005 | Yaung |
| 6,987,258 | B2 | 1/2006 | Mates |
| 6,996,147 | B2 | 2/2006 | Majumdar |
| 7,052,927 | B1 | 5/2006 | Fletcher |
| 7,064,372 | B2 | 6/2006 | Duan |
| 7,105,428 | B2 | 9/2006 | Pan |
| 7,109,517 | B2 | 9/2006 | Zaidi |
| 7,153,720 | B2 | 12/2006 | Augusto |
| 7,163,659 | B2 | 1/2007 | Stasiak |
| 7,208,783 | B2 | 4/2007 | Palsule |
| 7,230,286 | B2 | 6/2007 | Cohen |
| 7,235,475 | B2 | 6/2007 | Kamins |
| 7,241,434 | B2 | 7/2007 | Anthony |
| 7,254,151 | B2 | 8/2007 | Lieber |
| 7,262,400 | B2 | 8/2007 | Yaung |
| 7,265,328 | B2 | 9/2007 | Mouli |
| 7,272,287 | B2 | 9/2007 | Bise |
| 7,285,812 | B2 | 10/2007 | Tang et al. |
| 7,306,963 | B2 | 12/2007 | Linden |
| 7,307,327 | B2 | 12/2007 | Bahl |
| 7,311,889 | B2 | 12/2007 | Awano |
| 7,330,404 | B2 | 2/2008 | Peng |
| 7,335,962 | B2 | 2/2008 | Mouli |
| 7,336,860 | B2 | 2/2008 | Cyr |
| 7,358,583 | B2 | 4/2008 | Reznik |
| 7,381,966 | B2 | 6/2008 | Starikov |
| 7,416,911 | B2 | 8/2008 | Heath |
| 7,446,025 | B2 | 11/2008 | Cohen |
| 7,462,774 | B2 | 12/2008 | Roscheisen |
| 7,471,428 | B2 | 12/2008 | Ohara |
| 7,491,269 | B2 | 2/2009 | Legagneux |
| 7,507,293 | B2 | 3/2009 | Li |
| 7,521,322 | B2 | 4/2009 | Tang et al. |
| 7,524,694 | B2 | 4/2009 | Adkisson |
| 7,582,857 | B2 | 9/2009 | Gruev |
| 7,598,482 | B1 | 10/2009 | Verhulst |
| 7,622,367 | B1 | 11/2009 | Nuzzo |
| 7,626,685 | B2 | 12/2009 | Jin |
| 7,646,138 | B2 | 1/2010 | Williams |
| 7,646,943 | B1 | 1/2010 | Wober |
| 7,647,695 | B2 | 1/2010 | MacNutt |
| 7,649,665 | B2 | 1/2010 | Kempa |
| 7,655,860 | B2 | 2/2010 | Parsons |
| 7,663,202 | B2 | 2/2010 | Wang et al. |
| 7,692,860 | B2 | 4/2010 | Sato et al. |
| 7,704,806 | B2 | 4/2010 | Chae |
| 7,713,779 | B2 | 5/2010 | Firon |
| 7,719,678 | B2 | 5/2010 | Kamins |
| 7,719,688 | B2 | 5/2010 | Kamins |
| 7,732,769 | B2 | 6/2010 | Snider |
| 7,732,839 | B2 | 6/2010 | Sebe |
| 7,736,954 | B2 | 6/2010 | Hussain |
| 7,740,824 | B2 | 6/2010 | Godfried |
| 7,790,495 | B2 | 9/2010 | Assefa et al. |
| 7,888,155 | B2 | 2/2011 | Chen |
| 8,030,729 | B2 | 10/2011 | Quitoriano |
| 8,035,184 | B1 | 10/2011 | Dutta et al. |
| 8,049,203 | B2 | 11/2011 | Samuelson |
| 8,063,450 | B2 | 11/2011 | Wernersson et al. |
| 8,067,299 | B2 | 11/2011 | Samuelson |
| 8,084,728 | B2 | 12/2011 | Tsang |
| 8,093,675 | B2 | 1/2012 | Tsunemi et al. |
| 8,118,170 | B2 | 2/2012 | Sato |
| 8,143,658 | B2 | 3/2012 | Samuelson |
| 8,193,524 | B2 | 6/2012 | Bjorek |
| 8,208,776 | B2 | 6/2012 | Tokushima |
| 8,212,138 | B2 | 7/2012 | Landis |
| 8,222,705 | B2 | 7/2012 | Ogino |
| 8,242,353 | B2 | 8/2012 | Karg |
| 8,269,985 | B2 | 9/2012 | Wober |
| 8,274,039 | B2 | 9/2012 | Wober |
| 8,299,472 | B2 | 10/2012 | Yu et al. |
| 8,330,090 | B2 | 12/2012 | Agarwal |
| 8,384,007 | B2 | 2/2013 | Yu et al. |
| 8,455,857 | B2 | 6/2013 | Samuelson |
| 8,546,742 | B2 | 10/2013 | Wober |
| 2002/0003201 | A1 | 1/2002 | Yu |
| 2002/0020846 | A1 | 2/2002 | Pi et al. |
| 2002/0021879 | A1 | 2/2002 | Lee |
| 2002/0104821 | A1 | 8/2002 | Bazylenko |
| 2002/0109082 | A1 | 8/2002 | Nakayama et al. |
| 2002/0130311 | A1 | 9/2002 | Lieber |
| 2002/0172820 | A1 | 11/2002 | Majumdar et al. |
| 2003/0003300 | A1 | 1/2003 | Korgel et al. |
| 2003/0006363 | A1 | 1/2003 | Campbell |
| 2003/0077907 | A1 | 4/2003 | Kao et al. |
| 2003/0089899 | A1 | 5/2003 | Lieber |
| 2003/0103744 | A1 | 6/2003 | Koyama |
| 2003/0132480 | A1 | 7/2003 | Chau |
| 2003/0189202 | A1 | 10/2003 | Li |
| 2003/0227090 | A1 | 12/2003 | Okabe |
| 2004/0026684 | A1 | 2/2004 | Empedocles |
| 2004/0058058 | A1 | 3/2004 | Shchegolikhin |
| 2004/0065362 | A1 | 4/2004 | Watabe |
| 2004/0075464 | A1 | 4/2004 | Samuelson et al. |
| 2004/0095658 | A1 | 5/2004 | Buretea |
| 2004/0109666 | A1 | 6/2004 | Kim |

(56) References Cited

U.S. PATENT DOCUMENTS

| | | |
|---|---|---|
| 2004/0118337 A1 | 6/2004 | Mizutani |
| 2004/0118377 A1 | 6/2004 | Bloms |
| 2004/0122328 A1 | 6/2004 | Wang |
| 2004/0124366 A1 | 7/2004 | Zeng |
| 2004/0155247 A1 | 8/2004 | Benthien |
| 2004/0156610 A1 | 8/2004 | Charlton |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block |
| 2004/0241965 A1 | 12/2004 | Merritt |
| 2004/0261840 A1 | 12/2004 | Schmit |
| 2005/0009224 A1 | 1/2005 | Yang |
| 2005/0082676 A1 | 4/2005 | Andry |
| 2005/0087601 A1 | 4/2005 | Gerst, III |
| 2005/0095699 A1 | 5/2005 | Miyauchi et al. |
| 2005/0116271 A1 | 6/2005 | Kato |
| 2005/0133476 A1 | 6/2005 | Islam |
| 2005/0161662 A1 | 7/2005 | Majumdar |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0242409 A1 | 11/2005 | Yang |
| 2005/0284517 A1 | 12/2005 | Shinohara |
| 2006/0011362 A1 | 1/2006 | Tao |
| 2006/0038990 A1 | 2/2006 | Habib et al. |
| 2006/0113622 A1 | 6/2006 | Adkisson |
| 2006/0121371 A1 | 6/2006 | Wu |
| 2006/0146323 A1 | 7/2006 | Bratkovski |
| 2006/0162766 A1 | 7/2006 | Gee |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012980 A1 | 1/2007 | Duan |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1 | 4/2007 | Tennant |
| 2007/0082255 A1 | 4/2007 | Sun |
| 2007/0099292 A1 | 5/2007 | Miller |
| 2007/0104441 A1 | 5/2007 | Ahn et al. |
| 2007/0108371 A1 | 5/2007 | Stevens |
| 2007/0114622 A1 | 5/2007 | Adkisson |
| 2007/0120254 A1 | 5/2007 | Hurkx et al. |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1 | 6/2007 | Adkisson et al. |
| 2007/0138459 A1 | 6/2007 | Wong |
| 2007/0139740 A1 | 6/2007 | Igura |
| 2007/0140638 A1 | 6/2007 | Yang |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0164270 A1 | 7/2007 | Majumdar |
| 2007/0170418 A1 | 7/2007 | Bowers et al. |
| 2007/0172623 A1 | 7/2007 | Kresse |
| 2007/0187787 A1 | 8/2007 | Ackerson |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya et al. |
| 2007/0238265 A1 | 10/2007 | Kurashina |
| 2007/0238285 A1 | 10/2007 | Borden |
| 2007/0241260 A1 | 10/2007 | Jaeger |
| 2007/0246689 A1 | 10/2007 | Ge |
| 2007/0248958 A1 | 10/2007 | Jovanovich |
| 2007/0272828 A1 | 11/2007 | Xu |
| 2007/0285378 A1 | 12/2007 | Lankhorst et al. |
| 2007/0290193 A1 | 12/2007 | Tucker |
| 2007/0290265 A1 | 12/2007 | Augusto |
| 2008/0001498 A1 | 1/2008 | Muller |
| 2008/0029701 A1 | 2/2008 | Onozawa |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar et al. |
| 2008/0055451 A1 | 3/2008 | Kanbe |
| 2008/0065451 A1 | 3/2008 | For |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu et al. |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0145965 A1 | 6/2008 | Reznik |
| 2008/0149914 A1 | 6/2008 | Samuelson et al. |
| 2008/0149944 A1 | 6/2008 | Samuelson |
| 2008/0157253 A1 | 7/2008 | Starikov |
| 2008/0166883 A1 | 7/2008 | Liu et al. |
| 2008/0169017 A1 | 7/2008 | Korevaar |
| 2008/0169019 A1 | 7/2008 | Korevaar |
| 2008/0173615 A1 | 7/2008 | Kim |
| 2008/0188029 A1 | 8/2008 | Rhodes |
| 2008/0191278 A1 | 8/2008 | Maekawa |
| 2008/0191298 A1 | 8/2008 | Lin et al. |
| 2008/0211945 A1 | 9/2008 | Hong |
| 2008/0218740 A1 | 9/2008 | Williams |
| 2008/0224115 A1 | 9/2008 | Bakkers et al. |
| 2008/0225140 A1 | 9/2008 | Raynor |
| 2008/0233280 A1 | 9/2008 | Blanchet |
| 2008/0237568 A1 | 10/2008 | Kobayashi et al. |
| 2008/0246020 A1 | 10/2008 | Kawashima et al. |
| 2008/0246123 A1 | 10/2008 | Kamins |
| 2008/0248304 A1 | 10/2008 | Hanrath et al. |
| 2008/0251780 A1 | 10/2008 | Li et al. |
| 2008/0258747 A1 | 10/2008 | Kluth |
| 2008/0260225 A1 | 10/2008 | Szu |
| 2008/0266556 A1 | 10/2008 | Kamins |
| 2008/0277646 A1 | 11/2008 | Kim |
| 2008/0283728 A1 | 11/2008 | Inoue |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwat et al. |
| 2009/0001498 A1 | 1/2009 | Wang |
| 2009/0020150 A1 | 1/2009 | Atwater |
| 2009/0032687 A1 | 2/2009 | Lapstun |
| 2009/0046362 A1 | 2/2009 | Guo |
| 2009/0046749 A1 | 2/2009 | Mizuuchi |
| 2009/0050204 A1 | 2/2009 | Habib |
| 2009/0057650 A1 | 3/2009 | Lieber et al. |
| 2009/0072145 A1 | 3/2009 | Peczalski |
| 2009/0121136 A1 | 5/2009 | Gruss |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0153961 A1 | 6/2009 | Murakami et al. |
| 2009/0165844 A1 | 7/2009 | Dutta |
| 2009/0173976 A1 | 7/2009 | Augusto |
| 2009/0179225 A1 | 7/2009 | Fertig |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Want et al. |
| 2009/0199597 A1 | 8/2009 | Danley |
| 2009/0201400 A1 | 8/2009 | Zhang et al. |
| 2009/0206405 A1 | 8/2009 | Doyle |
| 2009/0224245 A1 | 9/2009 | Umezaki |
| 2009/0224349 A1 | 9/2009 | Gambino |
| 2009/0230039 A1 | 9/2009 | Hoenig |
| 2009/0233445 A1 | 9/2009 | Lee |

(56) References Cited

U.S. PATENT DOCUMENTS

| | | |
|---|---|---|
| 2009/0243016 A1 | 10/2009 | Kawahara et al. |
| 2009/0244514 A1 | 10/2009 | Jin |
| 2009/0260687 A1 | 10/2009 | Park |
| 2009/0261438 A1 | 10/2009 | Choi |
| 2009/0266418 A1 | 10/2009 | Hu |
| 2009/0266974 A1 | 10/2009 | Verhulst |
| 2009/0272423 A1 | 11/2009 | Niira |
| 2009/0278998 A1 | 11/2009 | El-Ghoroury et al. |
| 2009/0289320 A1 | 11/2009 | Cohen |
| 2009/0305454 A1 | 12/2009 | Cohen |
| 2010/0006817 A1 | 1/2010 | Ohlsson et al. |
| 2010/0019252 A1 | 1/2010 | Bratkovski et al. |
| 2010/0019296 A1 | 1/2010 | Cha |
| 2010/0019355 A1 | 1/2010 | Kamins |
| 2010/0090341 A1 | 4/2010 | Wan |
| 2010/0101633 A1 | 4/2010 | Park |
| 2010/0104494 A1 | 4/2010 | Meng |
| 2010/0110433 A1 | 5/2010 | Nedelcu et al. |
| 2010/0116976 A1 | 5/2010 | Wober |
| 2010/0127153 A1 | 5/2010 | Agarwal |
| 2010/0132779 A1 | 6/2010 | Hong |
| 2010/0133986 A1 | 6/2010 | Kim |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0178018 A1 | 7/2010 | Augusto |
| 2010/0186809 A1 | 7/2010 | Samuelson |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke et al. |
| 2010/0244169 A1 | 9/2010 | Maeda et al. |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0277607 A1 | 11/2010 | Choi |
| 2010/0282314 A1 | 11/2010 | Coakley |
| 2010/0295019 A1 | 11/2010 | Wang et al. |
| 2010/0302440 A1 | 12/2010 | Wober |
| 2010/0304061 A1 | 12/2010 | Ye et al. |
| 2010/0308214 A1 | 12/2010 | Wober |
| 2010/0320444 A1 | 12/2010 | Dutta |
| 2011/0018424 A1 | 1/2011 | Takada |
| 2011/0036396 A1 | 2/2011 | Jayaraman |
| 2011/0037133 A1 | 2/2011 | Su et al. |
| 2011/0050042 A1 | 3/2011 | Choi |
| 2011/0080508 A1 | 4/2011 | Katsuno et al. |
| 2011/0127490 A1 | 6/2011 | Mi |
| 2011/0133060 A1 | 6/2011 | Yu et al. |
| 2011/0133160 A1 | 6/2011 | Yu et al. |
| 2011/0135814 A1 | 6/2011 | Miyauchi et al. |
| 2011/0139176 A1 | 6/2011 | Cheung et al. |
| 2011/0146771 A1 | 6/2011 | Chuang |
| 2011/0147870 A1 | 6/2011 | Ang et al. |
| 2011/0180894 A1 | 7/2011 | Samuelson |
| 2011/0195577 A1 | 8/2011 | Kushibiki et al. |
| 2011/0226937 A1 | 9/2011 | Yu et al. |
| 2011/0248315 A1 | 10/2011 | Nam |
| 2011/0249219 A1 | 10/2011 | Evans |
| 2011/0249322 A1 | 10/2011 | Wang |
| 2011/0253982 A1 | 10/2011 | Wang et al. |
| 2011/0272014 A1 | 11/2011 | Mathai et al. |
| 2011/0297214 A1 | 12/2011 | Kim |
| 2011/0309237 A1 | 12/2011 | Seo et al. |
| 2011/0315988 A1 | 12/2011 | Yu et al. |
| 2011/0316106 A1 | 12/2011 | Kim |
| 2012/0009714 A1 | 1/2012 | Mouli |
| 2012/0029328 A1 | 2/2012 | Shimizu |
| 2012/0075513 A1 | 3/2012 | Chipman et al. |
| 2012/0196401 A1 | 8/2012 | Graham |
| 2012/0258563 A1 | 10/2012 | Ogino |

FOREIGN PATENT DOCUMENTS

| | | | |
|---|---|---|---|
| JP | 359013708 | A | 1/1984 |
| JP | 59198413708 | | 1/1984 |
| JP | 2002151715 | | 5/2002 |
| JP | 2005252210 | | 9/2005 |
| JP | 2007201091 | | 8/2007 |
| TW | 200845402 | | 11/2008 |
| TW | 200915551 | | 4/2009 |
| WO | 8603347 | | 6/1986 |
| WO | 0002379 | | 1/2000 |
| WO | 03107439 | A1 | 12/2003 |
| WO | 2005064337 | | 7/2005 |
| WO | 2008069565 | | 6/2008 |
| WO | 2008079076 | A1 | 7/2008 |
| WO | 2008131313 | | 10/2008 |
| WO | 2008135905 | | 11/2008 |
| WO | 2008135905 | A3 | 11/2008 |
| WO | 2008143727 | | 11/2008 |
| WO | 2009116018 | | 9/2009 |
| WO | 2009137241 | | 11/2009 |
| WO | 2010019887 | | 2/2010 |
| WO | 2010039631 | | 4/2010 |

OTHER PUBLICATIONS

International Preliminary Report on Patentability for PCT International Application No. PCT/US2010/035722, mailed Nov. 3, 2011.

International Search Report and Written Opinion for PCT International Patent Application No. PCT/US2010/051435, mailed Dec. 3, 2010.

International Search Report and Written Opinion for PCT International Patent Application No. PCT/US2009/063592, mailed Jan. 13, 2010.

International Search Report and Written Opinion for PCT International Patent Application No. PCT/US2010/059468, mailed Feb. 11, 2011.

Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.

International Search Report and Written Opinion for PCT International Patent Application No. PCT/US2010/059501, mailed Feb. 15, 2011.

Adler, Nanowire Lawns Make for Sheets of Image Sensors, NewScientist.com, Jul. 28, 2008.

International Search Report and Written Opinion for PCT International Patent Application No. PCT/US2010/051446, mailed Jan. 3, 2011.

Kim et al., Electronic Structure of Vertically Aligned Mn-Doped CoFe2O4 Nanowires and Their Application as Humidity Sensors and Photodetectors, Journal of Physical Chemistry C, Apr. 7, 2009.

Shimizu et al., Homoepitaxial Growth of Vertical Si Nanowires on Si(100) Substrate using Anodic Aluminum Oxide Template, (abstract only), Materials Research Society.

Song et al., Vertically Standing Ge Nanowires on GaAs(110) Substrates, Nanotechnology 19, Feb. 21, 2008.

"CMOS image sensor pixel optical efficiency and optical crosstalk optimization using FDTD Solutions" www.lumerical.com/fdtd_microlens/cmos_image_sensor_pixel_microlens.php, Mar. 19, 2009.

Furumiya, et al. "High-sensitivity and no-crosstalk pixel technology for embedded CMOS image sensor"; IEEE Electron Device Letters, vol. 48, No. 10, Oct. 2001.

International Search Report and Written Opinion for PCT International Application No. PCT/US2010/035722, mailed Jul. 20, 2010.

T. H. Hsu, et al. 'Light Guide for Pixel Crosstalk Improvement in Deep Submicron CMOS Image Sensor'; IEEE Electron Device Letters, vol. 25, No. 1, Jan. 2004.

(56) References Cited

OTHER PUBLICATIONS

Tseng, et al. 'Crosstalk improvement technology applicable to 0.14 βm CMOS image sensor'; IEEE International Electron Devices Meeting, Dec. 13-15, 2004; IEDM Technical Digest, pp. 997-1000. vbTab.

CMOS image sensor pixel microlens array optimization using FDTD Solutions, http://www.lumerical_com/ fdtd_microlens/cmos_image_sensor_pixel_microlens.php, pp. 1-2, Jun. 25, 2008.

Babinec et al., High-Flux, Low-Power Diamond Nanowire Single-Photon Source Arrays: An Enabling Material for Optical and Quantum Computing and Cryptography, obtained on Jul. 22, 2010 at URL: <http://otd.harvard.edu/technologies/tech.php?case=3702>.

Baillie et al., 'Zero-space microlenses for CMOS image sensors: optical modeling and lithographic process development', Publication Date May 2004, http://adsabs.harvard.edu/abs/2004SPIE.5377..953B, pp. 1-2.vbTab.

Barclay et al., Chip-Based Microcavities Coupled to NV Centers in Single Crystal Diamond, Applied Physics Letters, Nov. 12, 2009, vol. 95, Issue 19.

Brouri et al., Photon Antibunching in the Flurescence of Individual Colored Centers in Diamond, Optics Letters, Sep. 1, 2000, vol. 25, Issue 17.

Chung, Sung-Wook et al. Silicon Nanowire Devices. Applied Physics Letters, vol. 76, No. 15 (Apr. 10, 2000), pp. 2068-2070.

Deptuch et al., Vertically Integrated Circuits at Fermilab, IEEE Transactions on Nuclear Science, Aug. 2010, vol. 54, Issue 4, pp. 2178-2186.

Ekroll, On the Nature of Simultaneous Color Contrast, Dissertation, University of Kiel, 2005.

Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.

Fang et al., Fabrication of Slantingly-Aligned Silicon Nanowire Arrays for Solar Cell Applications, Nanotechnology, 2008, vol. 19, No. 25.

Gadelrab et al., The Source-Gated Amorphous Silicon Photo-Transistor, IEEE Transactions on Electron Devices, Oct. 1997, vol. 44, No. 10, pp. 1789-1794.

Gambino et al., 'CMOS Imager with Copper Wiring and Lightpipe,' Electron Devices Meeting, 2006. IEDM '06, International Publication Date: Dec. 11-13, 2006, pp. 1-4.

Garnett et al., Light Trapping in Silicon Nanowire Solar Cells, Nanoletters, Jan. 28, 2010, vol. 10, No. 3, pp. 1082-1087.

Guillaumée, et al., Polarization Sensitive Silicon Photodiodes Using Nanostructured Metallic Grids, Applied Physics Letters 94, 2009.

International Preliminary Report on Patentability for PCT International Patent Application No. PCT/U62009/055963, mailed Mar. 17, 2011.

International Search Report and Written Opinion for PCT International Application No. PCT/US2010/035726, mailed Jul. 21, 2010.

International Search Report and Written Opinion for PCT International Application No. PCT/US2010/057227, mailed Jan. 26, 2011.

International Search Report and Written Opinion for PCT International Patent Application No. PCT/US2009/055963, mailed Oct. 15, 2009.vbTab.

International Search Report and Written Opinion for PCT International Patent Application No. PCT/US2010/035727, mailed Sep. 27, 2010.

International Search Report and Written Opinion for PCT International Patent Application No. PCT/US2010/059491, mailed Feb. 9, 2011.

International Search Report and Written Opinion for PCT International Patent Application No. PCT/US2010/059504, mailed Apr. 7, 2011.

Jin-Kon Kim; 'New Functional Nanomaterials Based on Block Copolymers' http://www.ziu.edu.cn/adver/subjectizyhd/jz0707061313.html.

Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.

Junger, et. al., Polarization- and wavelength-sensitive sub-wavelength structures fabricated in the metal layers of deep submicron CMOSs processes, Proc. of SPIE, vol. 7712, 2010.

Kalkofen et al., Atomic Layer Deposition of Boron Oxide as Dopant Source for Shallow Doping of Silicon, Meeting Abstract 943, 217th ECS Meeting, MA2010-01, Apr. 25-30, 2010, Vancouver Canada, El—Advanced Gate Stack, Source / Drain, and Channel Engineering for Si-Based CMOS 6: New Materials, Process, and Equipment.

Kane, Why Nanowires Make Great Photodetectors, EurekAlert.com article, Apr. 25, 2007.

Kempa, Thomas J. et al. Single and Tandem Axial p-i-n Nanowire Photovoltaic Devices. Nano Letters. 2008, vol. 8, No. 10, 3456-3460.

Lee et al., Vertical Pillar-Superlattice Array and Graphene Hybrid Light Emitting Diodes, Nano Letters, 2010, vol. 10, pp. 2783-2788.

Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.

Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.

Loncar et al., Diamond Nanotechnology, SPIE Newsroom, May 18, 2010, obtained at url: <http://spie.org/x40194.xml?ArticleID=x40194>.

Loose et al., CMOS Detector Technology, Scientific Detector Workshop, Sicily, 2005, Experimental Astronomy, vol. 19, Issue 1-3, pp. 111-134.

Makarova et al., Fabrication of High Density, High-Aspect-Ratio Polyimide Nanofilters, Journal of Vacuum Science and Technology, Nov./Dec. 2009, vol. 27, No. 6., pp. 2585-2587.

N.L. Dmitruk, et al.; 'Modeling and Measurement of Optical Response of 1D Array of Metallic Nanowires for Sensing and Detection Application'; 26th International Conference on Microelectronics (MIEL 2008), Nis, Serbia, May 11-14, 2008.

Nguyen et al., Deep Reactive Ion etching of Polyimide for Microfluidic Applications, Journal of the Korean Physical Society, Sep. 2007, vol. 51, No. 3, pp. 984-988.

Ozgur Yavuzcetin, et al.; 'Index-tuned Anti-reflective Coating using a Nanostructured Metamaterial'; http://www.umass.edu/research/rld/bioportal/vuewtech.php?tid=40.

Parraga et al., Color and Luminance Information in Natural Scenes, Journal of Optical Society of America A, Optics, Image, Science and Vision, Jun. 1998, vol. 15, No. 6.

Reynard Corporation; 'Anti-Reflection Coatings (AR)', http://www.reynardcorp.com/coating_anti_reflection.php.

Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.

Rugani, First All-Nanowire Sensor, Technology Review, Aug. 13, 2008, Published by MIT.

Rutter, Diamond-Based Nanowire Devices Advance Quantum Science, SEAS Communications, Feb. 14, 2010, obtained at url:<http://news.harvard.edu/gazette/story/2010/02/digging-deep-into-diamonds/>.

Sarkar et. al., Integrated polarization-analyzing CMOS image sensor for detecting incoming light ray direction, Sensors Application Symposium (SAS) p. 194-199, 1010 IEEE.

Schmidt et al., Realization of a Silicon Nanowire Vertical Surround-Gate Field-Effect Transistor, Small, Jan. 2006, vol. 2, No. 1, pp. 85-88.

Thelander et al., Nanowire-Based One-Dimensional Electronics, Materials Today, Oct. 2006, vol. 9, No. 10, pp. 28-35.

Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.

Verheijen, Marcel A. et al. Growth Kinetics of Heterostructured GaP-GaAs Nanowires. J. Am. Chem. Soc. 2006, 128, 1353-1359.

(56) References Cited

OTHER PUBLICATIONS

Wang, Introduction to Nanotechnology—Where Opportunities arise & Great Future Being Built from Small Things.

Wong et al., Lateral Nanoconcentrator Nanowire Multijunction Photovoltaic Cells, GCEP Progress report, Apr. 20, 2009, pp. 1-18.

Ye et al., Fabrication Techniques of High Aspect Ratio Vertical Lightpipes Using a Dielectric Photo Mask, SPIE, Proceedings, Feb. 2010, vol. 7591.

Zhang et al., Ultrahigh Responsivity Visible and Infrared Detection Using Silicon Nanowire Phototransistors, Nanoletters, May 14, 2010, vol. 10, No. 6, pp. 2117-2120.

Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.

Madou, Properties and Growth of Silicon, Including Crystalline Silicon, Fundamentals of Microfabrication, 2nd Ed., CRC Press, 2002, pp. 125-204.

Holmes et al., Control of Thickness and Orientation of Solution-Grown Silicon Nanowires, Science, Feb. 25, 2000, vol. 287, No. 5457, pp. 1471-1473.

Morales et al., A Laser Ablation Method for the Synthesis of Crystalline Semiconductor Nanowires, Science, Jan. 9, 1998, vol. 279, pp. 208-211.

Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.

Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.

Wagner et al., Vapor-Liquid-Solid Mechanism of Single Crystal Growth, Applied Physics Letters, Mar. 1, 1964, vol. 4, No. 5, pp. 89-90.

Law et al., Semiconductor Nanowires and Nanotubes, Annu. Rev. Mater. Res., 2004, vol. 34, pp. 83-122.

Hochbaum et al., Controlled Growth of Si Nanowire Arrays for Device Integration, Nano Letters, Mar. 2005, vol. 5, No. 3, pp. 457-460.

Ge et al., Orientation-Controlled Growth of Single-Crystal Silicon-Nanowire Arrays, Advanced Materials, Jan. 18, 2005, vol. 17, No. 1, pp. 56-61.

Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.

International Search Report and Written Opinion for PCT International Patent Application No. PCT/US2011/060348, mailed Mar. 9, 2012.

International Search Report and Written Opinion for PCT International Patent Application No. PCT/US2011/064635, mailed Apr. 13, 2012.

International Search Report and Written Opinion for PCT International Patent Application No. PCT/US2011/066097, mailed Mar. 12, 2012.

International Search Report and Written Opinion for PCT International Patent Application No. PCT/US2011/067712, mailed May 3, 2012.

International Preliminary Report on Patentability mailed Dec. 23, 2011, for PCT/US10/51435.

Baomin Wang and Paul W. Leu, Nanotechology 23 (2012) 194003, 7 pages.

Sangmoo Jeon, et al., Nano Lett. 2012, 12, 2971-2976.

Sangmoo Jeong et al., J. Vac. Sci. Technol. A 30(6), Nov./Dec. 2012.

Sarkar et. al., Integrated polarization-analyzing CMOS image sensor for detecting incoming light ray direction, Sensors Application Symposium (SAS), Mar. 29, 2012, p. 194-199, 1010 IEEE.

Jin-Kon Kim; 'New Functional Nanomaterials Based on Block Copolymers' http://www.ziu.edu.cn/adver/subjectizyhd/jz0707061313.html, Jul. 7, 2011.

Ozgur Yavuzcetin, et al.; 'Index-tuned Anti-reflective Coating using a Nanostructured Metamaterial'; http://www.umass.eduiresearch/rld/bioportal/vuewtech.php?tid=40, Feb. 28, 2007.

Reynard Corporation; 'Anti-Reflection Coatings (AR)', http://www.reynardcorp.com/coating_anti_reflection.php, undated.

Shimizu et al., Homoepitaxial Growth of Vertical Si Nanowires on Si(100) Substrate using Anodic Aluminum Oxide Template, (abstract only), Materials Research Society, Fall 2007.

Wang, Introduction to Nanotechnology—Where Opportunities arise & Great Future Being Built from Small Things, Fall 2008.

International Preliminary Report and Written Opinion re PCT/US2010/059491, mailed Jun. 21, 2012.

International Search Report and Written Opinion re PCT/US2011/57325, mailed Jun. 22, 2012.

International Preliminary Report and Written Opinion re PCT/US2010/059468, mailed Jun. 21, 2012.

International Preliminary Report and Written Opinion re PCT/US2010/059504, mailed Jun. 21, 2012.

International Preliminary Report and Written Opinion re PCT/US2010/059496, mailed Jun. 21, 2012.

U.S. Office Action for U.S. Appl. No. 12/573,582, dated Jun. 28, 2012.

International Preliminary Search Report on Patentability of PCT/US201-057325, mailed May 2, 2013.

U.S. Office Action for U.S. Appl. No. 13/494,661, notification date Nov. 7, 2012.

U.S. Office Action for U.S. Appl. No. 12/633,313, dated Aug. 1, 2013, 20 pages.

U.S. Office Action for U.S. Appl. No. 12/966,514, dated Aug. 15, 2013, 17 pages.

U.S. Office Action for U.S. Appl. No. 12/966,535, mailed Jun. 14, 2013, 22 pages.

U.S. Office Action for U.S. Appl. No. 13/048,635, mailed Jun. 6, 2013, 24 pages.

U.S. Office Action for U.S. Appl. No. 12/966,573, dated Aug. 6, 2013, 13 pages.

Canadian Office Action of Canadian Application No. 3,676,376, dated Oct. 11, 2013.

Catrysse, et al., An Integrated Color Pixel in 0.18pm CMOS Technology, Proceedings IEDM 2001, pp. 559-562.

Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.

Geyer et al., Model for the Mass Transport during Metal-Assisted Chemical Etching with Contiguous Metal Films as Catalysts, J. Phys. Chem. C 2012, 116, 13446-13451.

Hopkins, Addressing sidewall roughness using dry etching silicon and Si02, Jul. 1, 2004, ElectrolQ, vol. 47, Issue 7.

Mei-Ling Kuo et al. "Realization of a near-perfect antireflection coating for silicon solar energy utilization" (Nov. 1, 2008, vol. 33, No. 21, Optics Letters).

Mukhopadhyay, When PDMS Isn't the Best, American Chemical Society, May 1, 2007.

Seo, et. al., "Multicolored vertical silicon nanowires," Nano Letters, vol. 11 issue 4, pp. 1851-1856, 2010.

Taiwanese Office Action of Taiwan Patent Application No. 099116881, issued Jul. 18, 2013 (8 pages).

U.S. Final Office Action for U.S. Appl. No. 12/966,514, mailed Mar. 19, 2013, 50 pages.

U.S. Final Office Action for U.S. Appl. No. 13/494,661, mailed Mar. 7, 2013, 10 pages.

* cited by examiner

PRIOR ART

NANO STRUCTURED LEDS

CROSS-REFERENCE TO RELATED APPLICATIONS

None.

BACKGROUND

PCT International Publication WO 2008/079076, published on Jul. 3, 2008, shows that nanowires can be used for constructing light emitting diodes (LED). Nano-structured LEDs produce light with very high efficiency. They provide a wide range in the choice of materials thereby allowing access to a wide range of wavelengths including red, green and blue light. It is well known, however, that PIN junction LEDs have a light output and wavelength that varies with temperature. Thus, even though the concept of an LED television (TV) is known, the practical application of LEDs for TV has not hitherto been possible.

DETAILED DESCRIPTION

Figure 1:
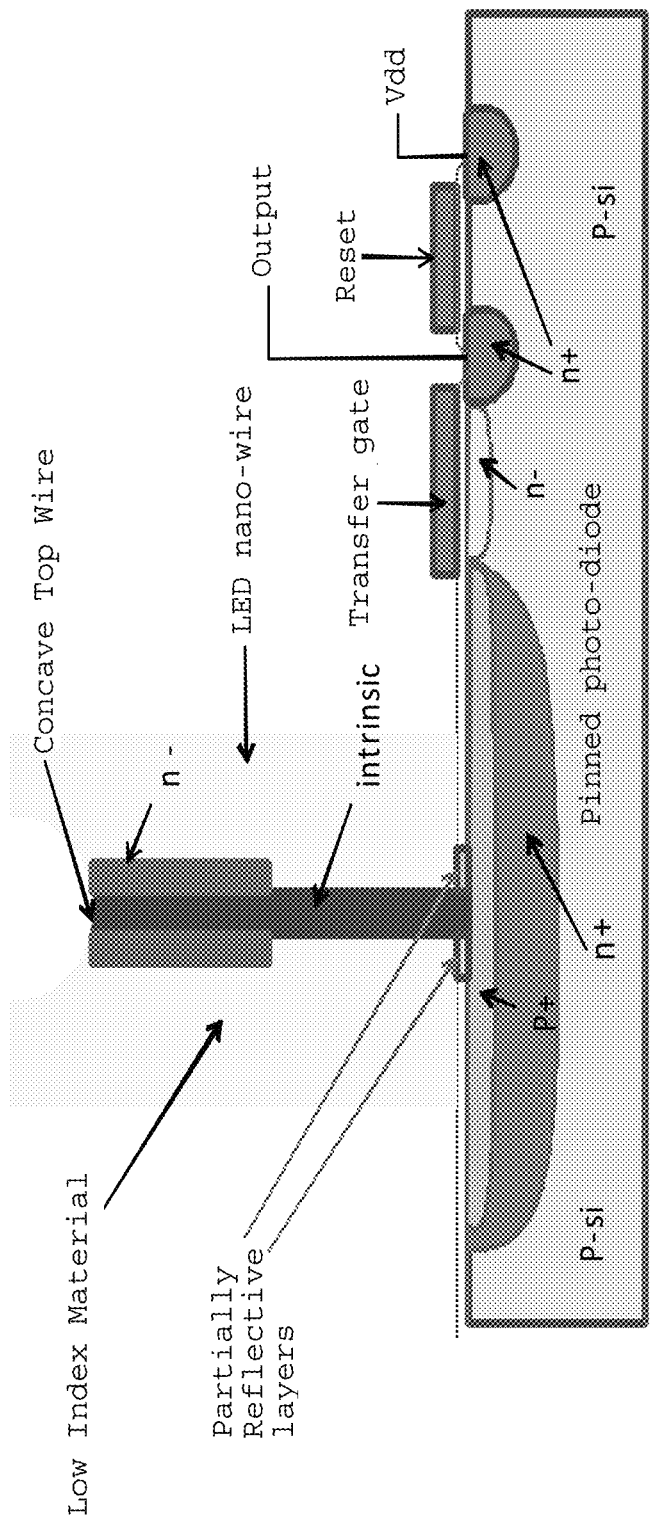
FIG. 1 is a schematic of a nanowire-containing light emitting diode (LED) with optical feedback.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

The term nanowire refers to a structure that has a thickness or diameter of the order of several nanometers, for example, 100 nanometers or less and an unconstrained length. An active nanowire is generally capable of converting photons into excitons. Nanowires could exhibit aspect ratios (length-to-width ratio) of 1000 or more. As such they could be referred to as 1-dimensional materials. Nanowires could have many interesting properties that are not seen in bulk or 3-D materials. This is because electrons in nanowires could be quantum confined laterally and thus occupy energy levels that could be different from the traditional continuum of energy levels or bands found in bulk materials. As a result, nanowires could have discrete values of electrical and optical conductance. Nanowires could include metallic (e.g., Ni, Pt, Au), semiconducting (e.g., Si, InP, GaN, etc.), and insulating (e.g., $SiO_2$, $TiO_2$) materials. Molecular nanowires are composed of repeating molecular units either organic or inorganic. Examples of nanowires include inorganic molecular nanowires ($Mo_6S_{9-x}I_x$, $Li_2Mo_6Se_6$), which could have a diameter of 0.9 nm, and can be hundreds of micrometers long. Other examples are based on semiconductors such as InP, Si, GaN, etc., dielectrics (e.g. $SiO_2$, $TiO_2$), or metals (e.g. Ni, Pt). An active-pixel sensor (APS), also commonly written active pixel sensor, is an image sensor consisting of an integrated circuit containing an array of pixel sensors, each pixel containing a photodetector and an active amplifier. A passive-pixel sensor is a pixel sensor without its own amplifier.

The term excitons refers to electron-hole pairs.

An active element is any type of circuit component with the ability to electrically control electron and/or hole flow (electricity controlling electricity or light, or vice versa). Components incapable of controlling current by means of another electrical signal are called passive elements. Resistors, capacitors, inductors, transformers, and even diodes are all considered passive elements. Active elements include in embodiments disclosed herein, but are not limited to, an active nanowire, an active waveguide, transistors, silicon-controlled rectifiers (SCRs), light emitting diodes, and photodiodes.

A waveguide is a system or material designed to confine and direct electromagnetic radiation of selective wavelengths in a direction determined by its physical boundaries. Preferably, the selective wavelength is a function of the diameter of the waveguide. An active waveguide is a waveguide that has the ability to electrically control electron and/or hole flow (electricity controlling electricity or light, or vice versa). This ability of the active waveguide, for example, is one reason why the active waveguide could be considered to be "active" and within the genus of an active element.

An optical pipe is an element to confine and transmit an electromagnetic radiation. The optical pipe can include a core and a cladding. The core could be a nanowire. The optical pipe could be configured to separate wavelengths of an electromagnetic radiation beam at a selective wavelength through the core and the cladding, wherein the core is configured to be both a channel to transmit the wavelengths up to the selective wavelength and an active element to detect the wavelengths up to the selective wavelength transmitted through the core. A core and a cladding are generally complimentary components of the optical pipe and are configured to separate wavelengths of an electromagnetic radiation beam at a selective wavelength through the core and cladding.

A photogate is a gate used in an optoelectronic device. Typically the photogate comprises a metal-oxide-semiconductor (MOS) structure. The photogate controls the accumulation of photons generated charges during the integration time of the photodiode and controls the transfer of charges when integration is over. A photodiode comprises a pn junction, however, a photogate can be placed on any type semiconductor material. A vertical photogate is a new structure. Normally, photogates are placed horizontally on planar photodiode devices. In a nanowire device, however, the photogate can be formed in a vertical direction. That is, the photogate can be oriented standing up covering the lateral surface of the nanowire.

A transfer gate is a gate of a switch transistor used in a pixel. The transfer gate's role is to transfer the charges from one side of a device to another. In some embodiments, the transfer gate is used to transfer the charges from the photodiode to the sensing node (or floating diffusion).

A reset gate is a gate used for resetting a device. In some embodiments, the reset gate is the sense node that is formed by an n+ region. Reset means to restore to original voltage level set by a certain voltage. In some embodiments, the voltage of the reset drain (RD) is the voltage used as a reset level. Reset means to clear any pending errors or events and bring a system to normal condition or initial state, usually in a controlled manner. Rest is usually done in response to an error condition or completion of events when it is impossible or undesirable for a processing activity to proceed. The ability for an electronic device to be able to reset itself in case of error, abnormal power loss or completion of events could be an aspect of embedded system design and programming.

An intrinsic semiconductor, also called an undoped semiconductor or i-type semiconductor, is a pure semiconductor without any significant dopant species present. The number of charge carriers is therefore determined by the properties of the material itself instead of the amount of impurities. In intrinsic semiconductors, the number of excited electrons and the number of holes are equal: n=p. The conductivity of intrinsic semiconductors can be due to crystal defects or to thermal excitation. In an intrinsic semiconductor, the number of electrons in the conduction band is equal to the number of holes in the valence band.

A SOC (system on a chip) is a single integrated circuit, i.e., a processor, a bus, and/or other elements on a single monolithic substrate. A system on a chip may include a configurable logic unit. The configurable logic unit may include a processor, interface, and a programmable logic on the same substrate. A system-on-chip IC may include various reusable functional blocks, such as microprocessors, interfaces, memory arrays, and DSPs (digital signal processors). Such pre-designed functional blocks are commonly called cores. Generally, the SOC may include a plurality of cores in a single chip. The cores embedded in the SOC may be separately designed and tested before being combined in a chip. SOCs may have significant advantages over electronic systems created on boards with discrete components. An integrated circuit having an SOC is generally much smaller than a circuit board based system. The reduction in size afforded by SOCs also may lead to improvements in power consumption and device speed. SOCs may combine fixed and programmable intellectual property cores with custom logic and memory, connected through a bus, on a single piece of silicon, thereby greatly reducing its overall cost.

A chip is a semiconducting material (usually silicon) on which an integrated circuit is embedded. A typical chip can contain millions of electronic components (transistors). There are different types of chips. For example, CPU chips (also called microprocessors) contain an entire processing unit, whereas memory chips contain blank memory.

An integrated circuit (also known as IC, microchip, silicon chip, computer chip or chip) is a device that may include many electronic components (transistors, capacitors, resistors, diodes, and other circuit components). These components are often interconnected to form multiple circuit components (e.g., gates, cells, memory units, arithmetic units, controllers, decoders, etc.) on the IC. An example of an integrated circuit is a central processing unit (CPU) in a computer. An integrated circuit may implement one or more cores that perform the various functions of the integrated circuit as well as circuitry for communicating with other integrated circuits and devices external to the integrated circuit. Integrated circuits typically comprise a semiconductor substrate on which several component layers have been formed to produce a large number of laterally-distributed transistors and other circuit devices. Additional connection layers may be formed on top of the component layers to provide interconnections among and power to the circuit devices, and input and output signal connections to the devices. An integrated circuit is generally fabricated utilizing a chip of silicon or other semiconductor material, also referred to as a die. The die consists of a substrate composed of a semiconductor material such as silicon or germanium. One side of the substrate may be provided with a plurality of circuit structures that makeup the integrated circuit and the other may be left as relatively bare substrate material that is normally planarized via a polishing step. A die is typically installed in a package, and electrically connected to leads of the package. A hybrid integrated circuit is a miniaturized electronic circuit constructed of individual semiconductor devices, as well as passive components, bonded to a substrate or circuit board. Integrated circuits can be classified into analog integrated circuits, digital integrated circuits and mixed signal integrated circuits (both analog and digital on the same chip).

A digital signal processor (DSP) is a specialized microprocessor designed specifically for digital signal processing such as video signal processing, generally in real-time computing. Digital signal processing algorithms typically require a large number of mathematical operations to be performed quickly on a set of data. Signals are converted from analog to digital, manipulated digitally, and then converted again to analog form.

A PN junction is a junction formed by combining p-type and n-type semiconductors together in very close contact. A PIN junction is a junction formed by combining a lightly doped 'near' intrinsic semiconductor region between a p-type semiconductor and an n-type semiconductor regions. The p-type and n-type regions are typically heavily doped because they are used for ohmic contacts.

The term junction refers to the region where the two regions of the semiconductor meet. It can be thought of as the border region between the p-type and n-type blocks.

An embodiment relates to a nanostrucuted LED with an optical feedback comprising a substrate, a nanowire protruding from a first side the substrate, an active region to produce light, a optical sensor and a electronic circuit, wherein the optical sensor is configured to detect at least a first portion of the light produced in the active region, and the electronic circuit is configured to control an electrical parameter that controls a light output of the active region. The nanostructured LED in one example implementation, may further comprise a volume element epitaxially connected to the nanowire. The volume element could provide a high doping degree for the formation of the active region, typically within or close to the nanowire, with or without requiring the nanowire itself to be doped. Preferably, the nanostructured LED without optical feedback would be the combination of the substrate, the nanowire and a volume element, wherein a portion of the nanowire and a portion of the volume element are configured to form the active region. The volume, element could be a cylindrical bulb, but is not limited to a cylindrical bulb with a dome-shaped top, a spherical/ellipsoidal, and pyramidal. The volume element can extend in three dimensions; can have a large volume, and a large surface. The volume element/nanowire architecture enhances both electrical and optical performance of a LED. By using different material compositions in the nanowire and the volume element, the nanowire material composition can be chosen to propagate into the volume element in order to decrease the optical disturbance by the connection with the nanowire.

The nanostructured LED of an embodiment may include a PN or PIN-junction that could produce an active region to produce light within the structure during use. The nanowire, a part of the nanowire, or a structure in connection with the nanowire, could form a waveguide directing at least a portion of the light produced in the active region in a given direction.

The nanowire and the volume element could be embedded in a low index material like $SiO_2$. In one possible implementation the low index region (e.g., a cover layer) is in turn enclosed by a cylindrical ring of metal to provide optical isolation of the each LED from its neighbors. This metal ring may also aid in the local removal of heat generated by each LED.

A nano-structured LED makes it possible to use a very large fraction of the light produced by the LED. This is at least partly achieved by the nanowire being used as a waveguide, directing the light produced in the junction out of the surface.

The use of the nanowire as a waveguide offers a possibility to direct light in well defined directions. By using concepts from the area of fiber optics light beams can be focused, or dispersed, depending on the intended use. In this case a concave surface on the nanowire and the silica surrounding it would help provide a focused beam of light suitable for a display system.

The nanowire technology offers possibilities in choices of materials and material combinations not possible in conventional bulk layer techniques. This could be used in the nanostructured LED to provide LEDs producing light in wavelength regions not accessible by conventional techniques, for example violet and UV.

The nano-structured LED allows for inclusions of heterostructures as well as areas of different doping within the nanowire, facilitating optimization of electrical and/or optical properties.

In embodiments herein that require precise control of the light output of an LED or the uniformity of multiple LEDs, arranged in a two dimensional grid for display purposes, an optical feedback loop to create a uniformity of light emission is highly desirable. Such a feedback loop would include an optical sensor to measure a fraction of the light output of the LED in real time and an electronic circuit to use the measurement to adjust the operating point of the LED.

An embodiment could include a nano-structured LED grown on a substrate that already has an embedded photodiode such as pinned photodiode. The light from the nanostructured LED is partially transmitted to the substrate where a photodiode measures and provides a signal proportional to the intensity of the light generated by the LED. This signal in turn is used in a feedback loop to control the bias point of the LED such that a stable light output is maintained at the desired intensity.

The nanowire-containing LED with optical feedback (NWLOF) could further comprise a partially reflective layer on the substrate surrounding and/or within the nanowire, wherein the partially reflective layer is configured to allow a first portion of the light to transmit through the partially reflective layer to the optical sensor and to allow at least a second portion of the light to reflect from a surface of the partially reflective layer.

The NWLOF could further comprise one or more cladding layers surrounding the nanowire, wherein the one or more cladding layers are configured such that the nanowire is configured to form a waveguide. The NWLOF could further comprise a low-index material having a lower refractive index surrounding the nanowire and a metal layer surrounding the low-index material.

The NWLOF could further comprise a volume element, wherein a portion of the nanowire and a portion of the volume element are configured to form the active region.

Figure 2:
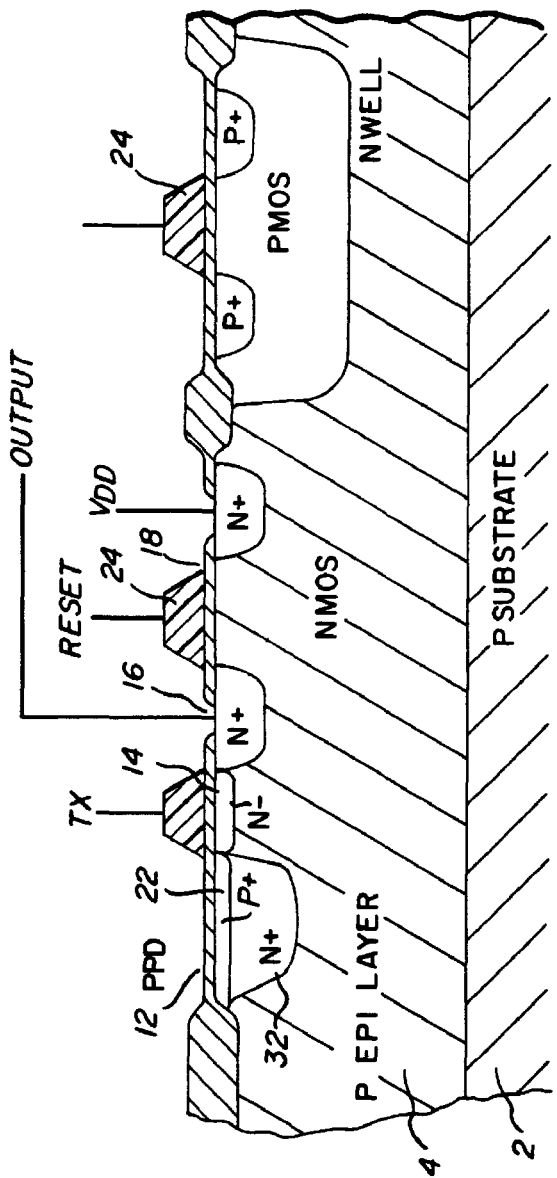
FIG. 2 is a schematic of a pinned photodiode.

FIG. 1 provides an example implementation of this concept. The LED could be composed of the p region in the substrate over which it is grown, the intrinsic nanowire made out of any of the suitable materials listed above and an n type epitaxial region surrounding and contacting the nanowire. A photodiode is embedded into the substrate on which the nanowire is grown. An example of a pinned photodiode is illustrated in FIG. 2.

In embodiments herein, there are a variety of possible implementations of photodiodes and nano-structured LEDs. FIG. 1 is an example implementation. Another possible implementation (not shown in FIG. 1) would place the LED on the back side of the substrate containing the photodiode. This would require thinning the substrate such that photons from the LED can easily be collected by the potential well (the n+ region in FIG. 1) of the photodiode.

A nanostructured LED according to the embodiments comprises of an upstanding nanowire. For the purpose of this application an upstanding nanowire should be interpreted as a nanowire protruding from the substrate in some angle, the upstanding nanowire for example being grown from the substrate, preferably by as vapor-liquid-solid (VLS) grown nanowires. The angle with the substrate will typically be a result of the materials in the substrate and the nanowire, the surface of the substrate and growth conditions. By controlling these parameters it is possible to produce nanowires pointing in only one direction, for example vertical, or in a limited set of directions. For example nanowires and substrates of zincblende and diamond semiconductors composed of elements from columns III, V and IV of the periodic table, such nanowires can be grown in the [111] directions and then be grown in the normal direction to any {111} substrate surface. Other directions given as the angle between normal to the surface and the axial direction of the nanowire include 70,53° {111}, 54,73° {100}, and 35,27° and 90°, both to {110}. Thus the nanowires define one, or a limited set, of directions.

According to the embodiments, a part of the nanowire or structure formed from the nanowire could be used as a waveguide directing and confining at least a portion of the light created in {in or from/out of?} the nanostructured LED in a direction given by the upstanding nanowire. The waveguiding nanostructured LED structure could include a high refractive index nanowire with one or more surrounding cladding with refractive indices less than that of the core. The structure could be either circular symmetrical or close to being circular symmetrical. Light waveguiding in circular symmetrical structures are well know for fiber-optic applications and many parallels can be made to the area of rare-earth-doped fiber optic devices. However, one difference is that fiber amplifier are optically pumped to enhance the light guided through them while the described nanostructured LED can be seen as an efficient light to electricity converter and vice versa.

Preferably, an output of the optical sensor is an input to the electronic circuit. Preferably, the electrical parameter comprises voltage or current. Preferably, the electronic circuit is configured to control voltage or current such that the light output is maintained substantially constant irrespective of a temperature of the active region within an operating temperature range of the active region. Preferably, the optical sensor comprises a pn or p-i-n photodiode having a performance characteristic that is substantially insensitive to a temperature in an operating temperature range of the active region. Preferably, at least a portion of the light produced in the active region is directed in a direction given by the nanowire. Preferably, the nanowire is configured to both produce light and form a waveguide.

Preferably, the volume element comprises a doping layer configured to provide a p or n region and a well layer. Preferably, the optical sensor comprises a pinned photodiode in the substrate. Preferably, the one or more cladding layers are configured to provide a graded refractive index such that a refractive index of the nanowire is higher than that of the one or more cladding layer. Preferably, the NWLOF comprises a plurality of the nanowires comprising different materials emit different ranges of wavelengths of the light. Preferably, the NWLOF comprises a plurality of the nanowires comprising different diameters that form waveguides for different ranges of wavelengths of the light. Preferably, the NWLOF comprises a plurality of the nanowires comprising different materials emit different ranges of wavelengths of the light and the NWLOF comprises a plurality of the nanowires comprising different diameters that form waveguides for different ranges of wavelengths of the light. Preferably, the nanowire and the volume element are arranged to direct the light through the nanowire and the substrate such that the light is emitted from a second side of the substrate opposite the first side. Preferably, The substrate contains a photodiode that is optically coupled to the nanowire. Preferably, the volume element is configured to spread the light by dispersion at a junction between the nanowire and the volume element. Preferably, the electronic circuit comprises a controller configured to calibrate the electrical parameter. Preferably, the controller comprises memory, the memory comprising values for controlling the electrical parameter so that the light output is set by the values stored in the memory. Preferably, the controller comprises memory; wherein the controller is configured to calibrate the electrical parameter to cause the light output to more closely match a target output based on target values of the light output stored in the memory. Preferably, the target values represent current values for different colors of the light. Preferably, the target values represent target brightness levels.

The waveguiding properties of the nanowire can be improved in different ways. The nanowire could have a first effective refractive index, $n_w$, and a cladding surrounding at least a portion of the nanowire could have a second effective refractive index, $n_c$, and by assuring that the first refractive index is larger than the second refractive index, $n_w > n_c$, good wave-guiding properties could be provided to the nanowire. The waveguiding properties may be further improved by introducing an optically active cladding.

The high index material in the nanowire could, for example, be silicon nitride having a refractive index of about 2.0. The lower index cladding layer material could, for example, be a glass, for example a material selected from Table I, having a refractive index about 1.5.

TABLE I

Typical Material Index of Refraction

| | |
|---|---|
| PESiN | 2.00 |
| PESiO | 1.46 |
| SiO2 | 1.46 |

In Table I, PESiN refers to plasma enhanced $Si_3N_4$ and PESiO refers to plasma enhanced $SiO_2$.

For a LED operating in different wavelengths from the visible to the IR and deep in the micrometer wavelengths, a variety of materials can be used, such as: Si, GaAs (p), InAs, Ge, ZnO, InN, GaInN, GaN AlGaInN, InP, InAsP, GaInP, InGaP:Si, InGaP:Zn, GaInAs, AlInP, GaAlInP, GaAlInAsP, GaInSb, InSb among others. To create CMOS circuits, Si and doped Si materials are preferable.

In one embodiment, the typical values of the refractive indexes for III-V semiconductor nanowire material are in the range from 2.5 to 5.5 when combined with glass type of cladding material (such as $SiO_2$ or $Si_3N_4$) having refractive indexes ranging from 1.4 to 2.3, satisfying the waveguiding requirement, $n_w > n_c$.

One consideration in the optimization of light extraction is to make the Numerical Aperture (NA) vary along the nanowire structure to optimize light extraction from the structure. In general, it is ideal to have the NA be highest when the light generation takes place furthest away from the exit location. This will maximize the light captured and guided toward the exit. In contrast, closer to the exit end of the structure, the NA can be made smaller since light generated will radiate in random directions and most of the radiate light will hit the top and side of the top part of the structure and exit. Having a lower NA in the top part of the structure also minimizes the light captures and guide back down through the structure that may not be ideal unless a reflector is inserted in the bottom of the structure. A low NA can be obtained by surrounding the III-V nanowire core with another cladding of different composition with slightly less refractive index.

A nanostructured LED according to the embodiments could comprise a substrate and a nanowire epitaxially grown from the substrate in a defined angle θ. A portion of the nanowire is enclosed by a volume element. The volume element is preferably epitaxially connected to the nanowire. A portion of or all of the nanowire could be arranged to act as a waveguiding portion directing at least a portion of the impinging light in a direction given by the elongated direction of the nanowire, and will be referred to as a waveguide. The nanowire could have a diameter in the order of 50 nm to 500 nm. The length of the nanowire could be of the order of 1 to 10 μm. The pn-junction results in an active region arranged in the nanowire.

The materials of the different members of the nanostructured LED are chosen so that the nanowire will have good waveguiding properties vis-a-vis the surrounding materials, i.e. the refractive index of the material in the nanowire should preferably be larger than the refractive indices of the surrounding materials.

If the nanowire has a first refracting index, $n_w$, the material surrounding the nanowire in wave guide portion, typically a cover layer, a second refractive index, $n_c$, and the a volume element, a third refractive $n_{ve}$, then $n_w > n_c$ and $n_w > n_{ve}$. Typical values for the nanostructured LED are $n_w \sim 4$, $n_c \sim 1.5$ and $n_{ve} \sim 3$.

In addition, the nanowire may be provided with one or more layers. A first layer may be introduced to improve the surface properties (i.e., reduce charge leakage) of the nanowire. Further layers, for example an optical layer may be introduced specifically to improve the waveguiding properties of the nanowire, in manners similar to what is well established in the area of fiber optics. The optical layer typically has a refractive index in between the refractive index of the nanowire and the surrounding cladding region material. Alternatively the intermediate layer has a graded refractive index, which has been shown to improve light transmission in certain cases. If an optical layer is utilized, the refractive index of the nanowire, $n_w$, should define an effective refractive index for both the nanowire and the layers.

The ability to grow nanowires with well defined diameters could be to optimize the waveguiding properties of the nanowire with regards to the wavelength of the light confined in the nanostructured LED. The diameter of the nanowire could be chosen so as to have a favorable correspondence to the wavelength of the desired light. Preferably the dimensions of the nanowire are such that a uniform optical cavity, optimized for the specific wavelength of the produced light, is provided along the nanowire. The nanowire generally is sufficiently wide to capture the desired light. A rule of thumb would be that diameter must be larger than $\lambda/2n_w$, wherein λ is the wavelength of the desired light and $n_w$ is the refractive index of the nanowire. As an example a diameter of about 60 nm may be appropriate to confine blue light only and one 80 nm may be appropriate for to confine both blue and green light in a silicon nanowire.

In the infrared and near infrared a diameter above 100 nm would be sufficient. An approximate preferred upper limit for the diameter of the nanowire is given by the growth constrains, and could be in the order of 500 nm. The length of the nanowire is typically and preferably in the order of 1-10 µm, providing enough volume for the active region.

A reflective layer could be in one embodiment, provided on the substrate and extending under the wire. The reflective layer is preferably provided in the form of a multilayered structure comprising repeated layers of silicates for example, or as a metal film.

An alternative approach to getting a reflection in the lower end of the nanowire could be to arrange a reflective layer in the substrate underneath the nanowire. Yet another alternative could be to introduce reflective means within the waveguide. Such reflective means can be a multilayered structure provided during the growth process of the nanowire, the multilayered structure comprising repeated layers of for example $SiN_x/SiO_x$ (dielectric) or GaAs/AlGaAs (semiconductor). Such repeated layers with controlled thickness could also serve as optical grating filters to precisely control the output wavelength of the LED to mitigate wavelength drift for example with temperature.

In a further embodiment, a major part of the produced light is directed by the waveguide of the nanowire in a downward direction through the substrate. The light can be directed through the entire thickness of the substrate, or alternatively the substrate could be provided with a cut out beneath the base of the nanowire in order to reduce the thickness of the substrate and thereby reduce the scattering or absorption of light in the substrate. The substrate is preferably made of transparent material. A portion, or preferably the entire outer surface of the volume element may be covered by a reflective layer that increases the radiation of the produced light through the waveguide. The reflective layer, for example formed of a metal, may additionally serve as a contact. Part of the nanowire and the substrate could optionally covered by a protective layer of SiC or SiN, for example.

In an embodiment, the volume element can be arranged to be a dispersive element, giving a light radiation that is essentially evenly distributed over a wide angle. Such device can be well suited for illuminating purposes wherein an even illumination is required. The active region may be arranged in the nanowire but alternatively may be within the volume element, and above the upper end of the nanowire, or radially outwards of the nanowire and possibly above. The nanowire should preferably at its lower end be provided with some of the reflective means, for example a reflective material within the nanowire, in order to redirect light upwards. The geometry of the volume element can be designed to further disperse the light. Dispersion is provided at the junction between the nanowire waveguide and the volume element and further at the edge formed by the upper boundary of the volume element. The height and width of the volume element can be chosen so that the edge disperses light further. One embodiment can be optimized for providing a collected and directionally oriented beam. The nanowire of relatively large diameter, preferably above 150 nm, can extend to the upper surface of the volume element. The nanowire can be provided with a concave lens like exit surface on the upper end.

Nanowires, acting as waveguides, can be used to improve the performance of conventional planar LEDs. In an embodiment, a plurality of nanowires can be arranged on the surface of a planar LED. Light is produced in the active region, which could be au active layer of the planar LED, for example of GaAsP. The nanowires can be epitaxially connected on top of the planar LED layers in order to get a good matching of the different parts. The nanowires may be coated by a cladding layer protecting the nanowires and/or improving the properties, for example $Si_3N_4$. The surface in between the nanowires can be preferably coated with a reflective layer, for example of Au. At least a part of the light, produced in the active region, could enter the nanowires that are acting as waveguides and leading the light away from the substrate plane.

Depending on the intended use of the nanostructured LED, availability of suitable production processes and cost for materials etc., a wide range of materials can be used for the different parts of the structure. Suitable materials for LED have to be matched with suitable materials for the photo diodes based on the wavelength of the light being emitted/detected by the system. Both the LED and the photo diode should work as intended in the wavelength range of light for which the system is configured to operate.

In addition, the nanowire based technology allows for defect free combinations of materials that otherwise would be impossible to combine. The III-V semiconductors are of particular interest due to their properties facilitating high speed and low power electronics. Suitable materials for the substrate include, but is not limited to: Si, GaAs, GaP, GaP:Zn, InAs, InP, GaN, $Al_2O_3$, SiC, Ge, GaSb, ZnO, InSb, SOI (silicon-on-insulator), CdS, ZnSe, CdTe. In the case of the present invention (i.e. for creating display structure in the visible light), a Si substrate is preferred since it embeds a CMOS photodiode underneath the LED. For wavelengths between blue and near IR, Si could be used in the photo diode. For wavelengths outside the range of light detected by Si, such as IR or UV light, it is possible to use GaAs in photodiodes for LED in the range of 800-1500 nm, e.g., 850 nm; and InGaAs/InP in the range 1310-1550 nm.

Suitable materials for the nanowire include, but is not limited to: Si, GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb. For this application the nano wire materials are carefully selected from the list above and the Table 1 below to produce red, green and blue light.

TABLE 1

List of band gaps

| Material | Symbol | Band gap (eV) @ 300K |
|---|---|---|
| Silicon | Si | 1.11 |
| Selenium | Se | 1.74 |
| Germanium | Ge | 0.67 |
| Silicon carbide | SiC | 2.86 |
| Aluminum phosphide | AlP | 2.45 |
| Aluminium arsenide | AlAs | 2.16 |
| Aluminium antimonide | AlSb | 1.6 |
| Aluminium nitride | AlN | 6.3 |
| Diamond | C | 5.5 |
| Gallium(III) phosphide | GaP | 2.26 |
| Gallium(III) arsenide | GaAs | 1.43 |
| Gallium(III) nitride | GaN | 3.4 |
| Gallium(II) sulfide | GaS | 2.5 (@ 295K) |
| Gallium antimonide | GaSb | 0.7 |
| Indium(III) nitride | InN | 0.7 |
| Indium(III) phosphide | InP | 1.35 |
| Indium(III) arsenide | InAs | 0.36 |
| Zinc oxide | ZnO | 3.37 |
| Zinc sulfide | ZnS | 3.6 |
| Zinc selenide | ZnSe | 2.7 |
| Zinc telluride | ZnTe | 2.25 |
| Cadmium sulfide | CdS | 2.42 |
| Cadmium selenide | CdSe | 1.73 |
| Cadmium telluride | CdTe | 1.49 |
| Lead(II) sulfide | PbS | 0.37 |

TABLE 1-continued

List of band gaps

| Material | Symbol | Band gap (eV) @ 300K |
|---|---|---|
| Lead(II) selenide | PbSe | 0.27 |
| Lead(II) telluride | PbTe | 0.29 |
| Copper(II) oxide | CuO | 1.2 |

The relationship between wavelength and bandgap energy may be obtained from:

$$E = h\nu$$
$$= \frac{hc}{\lambda}$$
$$= \frac{(4.13566733 \times 10^{-15} \text{ eV } s)(3 \times 10^8 \text{ m/s})}{\lambda}$$

Where E is the energy, ν is the frequency, λ is the wavelength of a photon, h is Planck's constant, and c is the Speed of light. For quick calculations, this reduces to $$E(\text{eV}) = \frac{1240}{\lambda(\text{nm})}$$

A stream of photons with a wavelength of 532 nm (green light) would have an energy of approximately 2.33 eV. Similarly, 1 eV would correspond to a stream of infrared photons of wavelength 1240 nm, and so on.

$$1 \text{ eV} = 8065.5447 \text{ cm}^{-1}$$

Possible donor dopants for example include GaP, Te, Se, S, etc, and acceptor dopants for the same material are Zn, Fe, Mg, Be, Cd, etc. It should be noted that the nanowire technology makes it possible to use nitrides such as SiN, GaN, InN and AlN, which facilitates fabrication of LEDs detecting light in wavelength regions not easily accessible by conventional technique. Other combination of particular commercial interest include, but is not limited to GaAs, GaInP, GaAlInP, GaP systems. Typical doping levels range from $1 \times 10^{18}$ cm$^{-3}$ to $1 \times 10^{20}$ cm$^{-3}$.

The appropriateness of low resistivity contact materials are dependent on the material to be deposited on, but metal, metal alloys, as well as non-metal compounds, like: Al, Al—Si, TiSi$_2$, TiN, W, MoSi$_2$, PtSi, CoSi$_2$, WSi$_2$, In, AuGa, AuSb, AuGe, PdGe, Ti/Pt/Au, Ti/Al/Ti/Au, Pd/Au, ITO (InSnO), etc. and combinations of, e.g., metal and ITO can be used.

The substrate could be an integral part of the device, since it also contains the photodiodes necessary to detect light that has not been confined to the nanowire. For this application, the substrate in addition also contains standard CMOS circuits to control the biasing, amplification and readout of the LED as well as any other CMOS circuit deemed necessary and useful. The substrate includes substrates having active devices therein. Suitable materials for the substrates include silicon and silicon-containing materials. Generally, each sensor element of the embodiment includes a nanostructured LED structure comprising a nanowire, a cladding enclosing at least a portion of the nanowire, a coupler and two contacts. Similarly, for light in higher wavelengths, GaAs circuitry can be used with the appropriate light emitting materials for those wavelengths.

In one embodiment, a micro lens could be located on the LED, for example, as shown in FIG. 1. The micro lens may comprise any of several optically transparent lens materials that are known in the art. Non-limiting examples include optically transparent inorganic materials, optically transparent organic materials and optically transparent composite materials. Most common are optically transparent organic materials. Typically the lens layers could be formed incident to patterning and reflow of an organic polymer material that has a glass transition temperature lower than the series of color filter layers, if present, or the patterned planarizing layer. Polymeric materials should preferably have a high degree of stability with temperature to act as micro lenses for LEDs since this device needs to perform at high temperatures. The micro lens of FIG. 1 does not require a new material; simply patterning the clad material to the right shape forms it.

A method of fabricating nanostructured LED is to first grow a nanowire. Part of the nanowire could then be masked and the volume element could be grown selectively. The volume element grows both axially and radial, hence, when the nanowire is masked partly, the nanowire becomes enclosed in the volume element. Appropriate masking materials are e.g. silicon nitride, silicon oxide etc.

Considering systems where nanowire growth is locally enhanced by a substance, as VLS grown nanowires, the ability to alter between radial and axial growth by altering growth conditions enables the procedure (nanowire growth, mask formation, and subsequent selective growth) and can be repeated to form nanowire/3D-sequences of higher order. For systems where the nanowire growth and selective growth are not distinguished by separate growth conditions it may be better to first grow the nanowire along the length and by different selective growth steps grow different types of 3D regions or volume elements.

According to the present invention, in order to fabricate a light emitting pn diode/array with active nanowire region(s) formed of GaAs and InGaP, comprises the steps of: Preferably, the substrate could be Si containing the photodiode. Subsequently, to grow a GaAs nano wire, for example, one could lay down an epitaxial layer of p+ GaP on the silicon substrate.

1. Defining of local catalyst/catalysts on a p+ GaP substrate by lithography.
2. Growing GaAs nanowire from local catalyst. The growth parameters adjusted for catalytic wire growth.
3. Radial growing of thin InGaP concentric layer around the nanowire (cladding layer).
4. Depositing of SiO$_2$ as mask material.
5. Back etching of mask to open up the upper parts of the nanowires.
6. Selective growing of n+ InGaP volume element. The growth parameters adjusted to give radial growth.
7. Forming contacts on the volume element and to the substrate.

In the embodiments herein, silicon nanowires (NW) could be grown on a layer of silicon. The process could apply for growing Si NW on dielectric layer, or for III-V compound grown on the appropriate substrate, including Si substrate with or without a thin Molybdenum layer.

The silicon nanowire of the embodiments disclosed herein could be made as follows. A substrate is provided which comprises silicon having a silicon dioxide surface. The surface can be modified to remove an oxide layer with a surface treatment to promote adsorption of a gold nanoparticle, or gold alloys nanoparticle like AuGa. Onto this modified surface, preferably a Si substrate have the {111} plane, (Au is used to create the Si—Au eutectic point and grow the Si nanowire when SiH4 is introduced), the gold nanoparticle can be formed by deposition of a gold layer, followed by removal of the gold layer over regions other than desired location of the gold nanoparticle. The silicon nanowire can be grown, for example, by plasma enhanced vapor-liquid-solid growth. In a first step, a catalyst particle (typically gold or gold alloy) may be deposited on top of the substrate by either a standard electron beam lithography (EBL) process or using self-assembly of prefabricated catalyst colloids. Other processes for depositing catalysts, such as electroless plating may also be used.

The diameters of nanowires after growth are generally determined by the area of the catalyst particles. Therefore, a desired diameter of the nanowire can be synthesized by depositing a catalyst particle with an appropriate size. This step typically determines the functionality of the nanowire pixel because the nanowire diameter should be of an appropriate cross-section area to allow the transmission of light with specific wavelengths and long enough to allow the light absorption and creation of excitons (electron-hole pairs).

A single nanowire can be grown from the catalyst particle under proper conditions. Using silicon as an example, a suitable nanowire can be grown using the vapor-liquid-solid (VLS) process with presence of $SiH_4$ at, for example, temperature at 650 C. and pressure of 200 mTorr. A temperature below 450 C. is advisable for the integration compatibility of CMOS circuits and nanowire synthesis. Many researchers have been able to synthesize silicon nanowires at 430 C. or even below 400 C. by using some special techniques, for example, using aluminum catalysts or plasma enhanced growth. During the VLS process, the silicon nanowire can be doped to create a $p^+$-i(intrinsic)-$n^+$ structure by introducing $B_2H_6$, $H_2$ and $PH_3$, respectively.

Nanowires have a higher surface-to-volume ratio than the corresponding bulk materials. Therefore the surface states of nanowires play a more important role in their electronic and optical properties. The impact of nanowire surface states, however, can be minimized by surface passivation after the nanowire synthesis. Typically, surface passivation can be achieved with a monolayer of materials to react with silicon dangling bonds at the surface of the nanowire. This is accomplished with the formation of stable bonds after reaction. Advantageously, passivation has almost no effect on the nanowire physical dimension since it is only one-monolayer thick.

Subsequent steps could relate to the forming of an epitaxial layer that is n or p doped covering the nanowire or of one or more of the dielectric layers around the nanowire.

The epitaxial n or p doped layer covering the nanowire could be grown using vapor-phase epitaxy (VPE), a modification of chemical vapor deposition. Molecular-beam epitaxy, liquid-phase epitaxy (MBE and LPE) and solid-phase epitaxy (SPE) could also be used. In each of these processes, a dopant could be added into the epitaxially grown layer during the epitaxial layer growth process.

A conformal dielectric coating around the nanowire, if needed, could be made by chemical vapor deposition (CVD), atomic layer deposition (ALD), oxidation or nitration could be made around the nanowire. Then, doped glass dielectric layer could be formed on the conformal dielectric coating by plasma enhanced chemical vapor deposition, spin-on coating or sputtering, optionally with an initial atomic layer deposition. The deposited doped glass dielectric layer could be etched back by chemical-mechanical planarization or other methods of etching.

In one embodiment, a funnel and a lens on the funnel to channel electromagnetic radiation such as light out of the nanowire waveguide could be made as follows: deposition of a glass/oxide/dielectric layer by CVD, sputter deposition or spin-on coating; application of a photoresist on the deposited glass/oxide/dielectric layer; removal of the photoresist outside an opening centered over the nanowire within the deep cavity; and forming a coupler by semi-isotropic etching in the glass/oxide/dielectric layer.

Additional steps could relate to the forming of a metal or metal oxide ring layer around the one or more dielectric layers by depositing a metal such a copper on the vertical walls of the one or more dielectric layers.

The growth process can be varied in known ways to include heterostructures in the nanowires, provide reflective layers etc. The stem in some embodiment can be provided by first growing a thin nanowire, depositing a reflective layer or a selective growth mask covering the lower part, and radial growing a cladding layer or increasing the nanowire thickness.

The nanowire-containing LEDs with optical feedback could be used in an image display device having a large number of identical display elements, generally greater than 1 million, in a grid. The embodiments disclosed here would allow the manufacture of such a grid of NWLOF.

In some implementations a large plurality of nanostructured LEDs can be provided in one image display device. A plurality of nanostructured LEDs can be epitaxially grown on a Zn-doped GaP substrate. The nanowires of the LEDs can be of intrinsic GaAs, and provided with a concentric layer of undoped InGaP. The volume elements can comprise of Si-doped InGaP. The lower parts of the nanowires and the substrate can be covered by a $SiO_2$-layer. A back plane contact can be provided on the substrate connecting a plurality of LEDs, and each individual LED can be provided with a wrap around contact on the volume elements. The wrap around contacts can be connected for a group-wise addressing of the LEDs.

In one embodiment the inherent property that nanowires grow in a limited set of preferred directions, as discussed above, can be used to grown nanowires in the same direction, or one of a limited set of directions. The direction of the grown nanowires could be perpendicular to the substrate or at an angle from the perpendicular to the substrate. Preferably the LEDs can be arranged to produce fairly directed light beams. Adjacent to the group of LEDs a reflective material can be provided, with an angle to the substrate corresponding to the direction of the LEDs so that the light emitted from the LEDs can be reflected by the reflective material in a desired direction.

Figure 4:
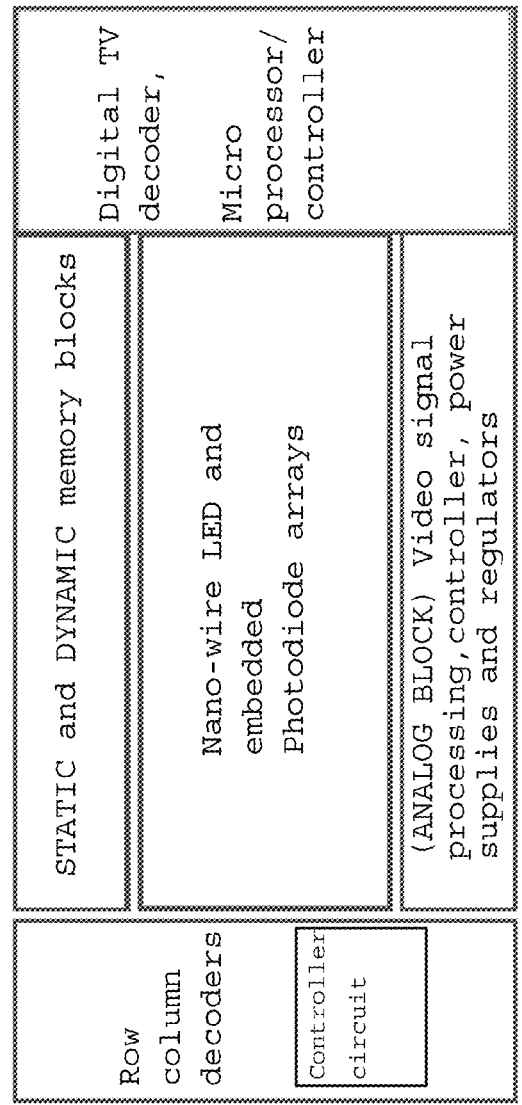
FIG. 4 is a schematic of a chip partitioned to include the LED array and optical feedback.

Additional features of the image display devices disclosed herein are: (1) A light emitting surface with different pixels. There are three types of pixels, each emitting one color: red, blue or green. The display color is constructed from the combination of the three (red, blue and green) colors. The eye (human) views the surface directly through a magnifying lens and thus sees the image. The image could change with time to display moving objects and the like. (2) There could be the same pixel configuration as in feature (1), but the light emitted from the surface is focused through a lens, and then the final image is displayed on a non-active surface such as a screen. Both cases are viable embodiments. The first relates to a display such as TV, computer screen and the like, and the other is to an electronic projector. An illustration of how a chip of the image display device could be partitioned is shown in FIG. 4 to create a system on a chip (SOC). The video image from the LED array is focused through a lens and is viewed either directly as in a head mounted display or is projected onto a screen Preferably, the plurality of NWLOFs comprises at least a first active region for emitting a first color, a second active region for emitting a second color, and a third active region for emitting a third color. Preferably, the image display does not include a color filter.

Optionally, the image display device could have three chips to produce red, green and blue and the light, respectively, from each chip and to be interleaved by an external circuit and optical system. Each chip may only consist of a single color array of LEDs for the ease of manufacturing.

Preferably, the plurality of NWLOFs comprises at least a first electrical parameter to control emission of the first color, a second electrical parameter to control emission of the second color, and a third electrical parameter to control emission of the third color. Preferably, the image display comprises a display device, a microdisplay, a computer display, TV and a display system on a chip.

According to embodiments herein, it is possible to manufacture a device that has other complex circuits besides the NWLOF. Such a device could be a system on a chip (SoC) made on a silicon substrate, for example.

For example, the display (such as that shown in FIG. 4) could be a self contained display device that has the following circuits: a NWLOF grid; a row column addressing circuitry; a video signal processing chain for the photodiode array; a feedback loop circuitry for the bias circuits of the nanowire LED; power supplies and regulation circuits; digital circuits to decode standard video signals; and a thermally sound design that would allow for the management of all heat generated by the device. Once this SoC is accomplished, it would now be possible to design a single chip display system that requires nothing other than a lens to operate as display SoC.

Figure 3:
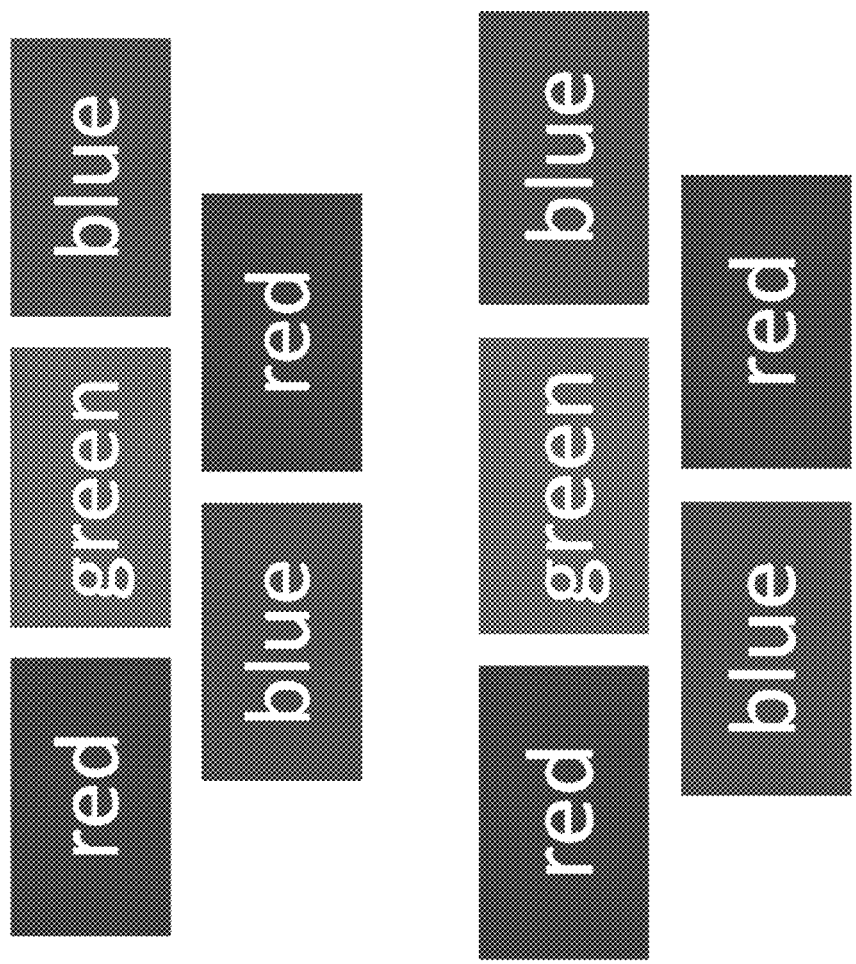
FIG. 3 is a schematic of tessellations for the LED array.

These are the major circuit blocks required for a display chip:
1) A nano wired LED array in a tessellation described in FIG. 3.
2) Row column decode circuitry to individually address an LED and its associated photodiode or to a mapping of a group of contiguous LEDs to a single photodiode.
3) A major analog circuit block to provide the Video Signal Processing Chain for read out of photodiode array to provide the input to the controller circuit, the controller circuit itself being for stabilizing the light output of the LED array individually or in groups, power supplies and regulators for the LED array and the photodiode array.
4) A digital video decoding circuit to convert standard video input into a form necessary for all other circuits to operate in the chip.
5) Memory blocks, both dynamic and static, to be used as video data buffers and program storage.
6) Microprocessor, which is optional, could be included to carry out any of the functions capable of a microprocessor.

With the appropriate choice of materials for the nano-wire, the epitaxial layer and the diameter of the nanowire, Red, Green and Blue LEDs can be implemented. The preferred tessellations for the LED array is shown in FIGS. 3(a) and 3(b). There are a number of other possible arrangements, for example:

The pinned photodiode shown in FIG. 2 is described in U.S. Pat. No. 6,100,551, which is incorporated herein in their entirety by reference. FIG. 2 illustrates a cross sectional diagram of the devices used in creating the sensor of the present invention. This is the result of integration of an active pixel sensor (APS) architecture typically fabricated in CMOS technology with a pinned photodiode device (item 12 PPD in FIG. 2) using a mixed process technology. The PPD becomes the photoactive element in an XY-addressable area array.

The uniformity of the photodiode array is first ensured by dark and uniform illumination of the entire array with an external source while the nano wire LEDs are turned off. The gains, the black levels of the three color channels, and whatever other controls available in the circuits are then adjusted to their initial values. Similarly, the pixel to pixel uniformity of the LED array is ensured by setting the loop gain values of the photodiode/LED pair either individually or in mapped groups through an initial calibration process.

In subsequent operation the LED output will retain immunity to temperature variation to the degree that the pinned photodiode allows. In addition this approach will mitigate the development of non-uniformity and local or global drift in brightness, including fixed pattern noise due to manufacturing non-uniformity, in the display generated by the LED array during operation.

The entire processing, memory, control, and driver system may be generally referred to as a controller. Various other types of circuitry may also act as the controller, and the embodiment is not limited to a particular circuitry used.

All references mentioned in the application are incorporated herein in their entirety by reference.

The invention claimed is:
1. A device comprising a substrate, a nanowire protruding from a first side of the substrate, a light-emitting diode (LED) comprising a portion of the nanowire, an optical sensor in the substrate and surrounding the nanowire, and an electronic circuit, wherein the optical sensor is configured to detect at least a first portion of a light produced in the LED by recombination of electrons and holes in the LED, and the electronic circuit is configured to control a bias of the LED.

2. The device of claim 1, wherein the LED comprises a PN junction or a PIN-junction.

3. The device of claim 1, wherein an output of the optical sensor is an input to the electronic circuit.

4. The device of claim 1, wherein the electronic circuit is configured to control the bias such that the light output of the LED is maintained substantially constant irrespective of a temperature of the LED within an operating temperature range of the LED.

5. The device of claim 1, wherein the electronic circuit is configured to control the bias such that the light output is maintained substantially constant irrespective of composition variations of the LED.

6. The device of claim 1, wherein at least a portion of the light produced in the LED is directed in a direction parallel with the nanowire.

7. The device of claim 1, wherein the nanowire is a waveguide.

| R | G | B | R | G | B | R | G | B | R | G | B | R | G | B | R | G | B |
|---|---|---|---|---|---|---|---|---|---|---|---|---|---|---|---|---|---|
| B | G | R | B | G | R | B | G | R | B | G | R | B | G | R | B | G | R |
| R | G | B | R | G | B | R | G | B | R | G | B | R | G | B | R | G | B |

8. The device of claim 1, further comprising a volume element, wherein the LED comprises a portion of the volume element.

9. The device of claim 8, wherein the volume element comprises a doping layer configured to provide a p or n region and a well layer.

10. The device of claim 1, wherein the optical sensor comprises a pinned photodiode.

11. The device of claim 1, further comprising a partially reflective layer on the substrate surrounding and/or within the nanowire, wherein the partially reflective layer is configured to allow the first portion of the light to transmit through the partially reflective layer to the optical sensor and to allow at least a second portion of the light to reflect from a surface of the partially reflective layer.

12. The device of claim 1, further comprises one or more cladding layers surrounding the nanowire, wherein the one or more cladding layers are configured such that the nanowire is configured to form a waveguide.

13. The device of claim 12, wherein the one or more cladding layers are configured to provide a graded refractive index such that a refractive index of the nanowire is higher than that of the one or more cladding layer.

14. The device of claim 1, wherein the device comprises a plurality of the nanowires comprising different materials emit different ranges of wavelengths of light.

15. The device of claim 1, wherein the device comprises a plurality of the nanowires comprising different diameters that form waveguides for different ranges of wavelengths of light.

16. The device of claim 1, wherein the device comprises a plurality of the nanowires comprising different materials emit different ranges of wavelengths of light and the device comprises a plurality of the nanowires comprising different diameters that form waveguides for different ranges of wavelengths of light.

17. The device of claim 8, wherein the nanowire and the volume element are arranged to direct the light through the nanowire and the substrate such that the light is emitted from a second side of the substrate opposite the first side.

18. The device of claim 8, wherein the volume element is configured to spread the light by dispersion at a junction between the nanowire and the volume element.

19. The device of claim 1, wherein the electronic circuit comprises a controller configured to calibrate the bias.

20. The device of claim 19, wherein the controller comprises memory, the memory comprising values for controlling the bias so that light output of the LED is set by the values stored in the memory.

21. The device of claim 19, wherein the controller comprises memory, wherein the controller is configured to calibrate the bias to cause light output of the LED to match a target output based on target values of the light output stored in the memory.

22. The device of claim 21, wherein the target values represent current values for different colors of the light.

23. The device of claim 21, wherein the target values represent target brightness levels.

24. The device of claim 1, further comprising a low-index material surrounding the nanowire and a metal layer surrounding the low-index material; wherein the low-index material has a lower refractive index than the nanowire.

25. The device of claim 1, wherein the device is an electronic chip.

26. The device of claim 25, wherein the LED produces only a single color light.

27. The device of claim 21, wherein the electronic chip comprises at least a first LED for emitting a first color, a second LED for emitting a second color, and a third LED for emitting a third color.

28. The device of claim 25, wherein the chip does not include a color filter.

29. An image display comprising a device of claim 1.

30. The image display of claim 29, wherein the device comprises at least a first LED for emitting a first color, a second LED for emitting a second color, and a third LED for emitting a third color.

31. The image display of claim 29, wherein the image display does not include a color filter.

32. The image display of claim 29, configured to produce a first color, a second color and a third color, and configured to control emission of the first color by a first bias, control emission of the second color by a second bias, and control emission of the third color by a third bias.

33. The image display of claim 29, wherein the optical sensor comprises a PN or PIN photodiode having a performance characteristic that is substantially insensitive to a temperature in an operating temperature range of the LED.

34. The image display of claim 29, wherein the optical sensor comprises a PN or PIN photodiode having a performance characteristic that is substantially insensitive to composition variations of the LED.

35. The image display of claim 29, wherein the image display comprises a television system on a chip.

36. The image display of claim 29, wherein the image display comprises a micro-display.

37. The image display of claim 29, further comprising a lens configured to project the light on a screen.

38. The image display of claim 29, wherein the substrate comprises silicon.

39. The image display of claim 38, wherein the nanowire comprises materials that emits red, green or blue light.

40. The device of claim 27, wherein the first, second and third colors are red, green and blue, respectively.

41. The device of claim 1, further comprising a feedback loop between the optical sensor and the electronic circuit.

42. The device of claim 1, wherein the electronic circuit is configured to control the bias based on an output of the optical sensor so that light output of the LED is maintained substantially constant irrespective of a temperature of the LED.

43. The device of claim 1, wherein the optical sensor comprises a PN or PIN photodiode having a performance characteristic that is substantially insensitive to a temperature in an operating temperature range of the LED.

44. The device of claim 1, wherein the LED is optically isolated from any neighboring LED.

45. The device of claim 1, wherein the optical sensor measures and provides a signal proportional to an intensity of the light.

46. The device of claim 1, wherein at least a portion of the light is infrared.

47. The device of claim 1, wherein the nanowire has a diameter above 100 nm.

48. The device of claim 1, wherein the nanowire comprises GaAs.

* * * * *